(12) United States Patent
Wang et al.

(10) Patent No.: US 11,977,434 B2
(45) Date of Patent: May 7, 2024

(54) DETERMINATION OF FAULTY STATE OF STORAGE DEVICE

(71) Applicant: Telefonaktiebolaget LM Ericsson (publ), Stockholm (SE)

(72) Inventors: Yantao Wang, Beijing (CN); Jing Liu, Beijing (CN); Lijun Shen, Beijing (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 109 days.

(21) Appl. No.: 16/330,301

(22) PCT Filed: Sep. 5, 2016

(86) PCT No.: PCT/CN2016/098142
§ 371 (c)(1),
(2) Date: Mar. 4, 2019

(87) PCT Pub. No.: WO2018/040115
PCT Pub. Date: Mar. 8, 2018

(65) Prior Publication Data
US 2019/0205198 A1 Jul. 4, 2019

(51) Int. Cl.
*G06F 11/00* (2006.01)
*G06F 11/07* (2006.01)
*G06F 11/30* (2006.01)

(52) U.S. Cl.
CPC .......... *G06F 11/0757* (2013.01); *G06F 11/00* (2013.01); *G06F 11/0727* (2013.01); *G06F 11/0793* (2013.01); *G06F 11/30* (2013.01); *G06F 11/3034* (2013.01)

(58) Field of Classification Search
CPC .. G06F 11/0757; G06F 11/00; G06F 11/0727; G06F 11/0793; G06F 11/30; G06F 11/3034
See application file for complete search history.

(56) References Cited

U.S. PATENT DOCUMENTS

| 6,122,574 A | 9/2000 | Ohtsu et al. |
| 8,467,281 B1 | 6/2013 | Colon et al. |
| 2006/0112232 A1 | 5/2006 | Zohar et al. |

(Continued)

FOREIGN PATENT DOCUMENTS

| CN | 101127233 A | 2/2008 |
| CN | 101894083 A | 11/2010 |

(Continued)

OTHER PUBLICATIONS

International Search Report and Written Opinion dated Jun. 7, 2017 issued in International Application No. PCT/CN2016/098142. (7 pages).

(Continued)

*Primary Examiner* — Katherine Lin
(74) *Attorney, Agent, or Firm* — Sage Patent Group

(57) ABSTRACT

Disclosed are a method and electronic device for determining a faulty state of a storage device. A first time length of a first access to a set of blocks of a storage device is determined. Then, the first time length of the access and a threshold time length are compared. If the first time length exceeds the threshold time length, it is determined that the blocks are in a potential faulty state.

7 Claims, 3 Drawing Sheets

(56) References Cited

U.S. PATENT DOCUMENTS

| | | |
|---|---|---|
| 2010/0299470 A1 | 11/2010 | Uno |
| 2015/0095698 A1 | 4/2015 | Ema |
| 2015/0131379 A1 | 5/2015 | Oh |
| 2015/0262712 A1* | 9/2015 | Chen ..................... G11C 29/42 |
| | | 714/723 |
| 2016/0299805 A1* | 10/2016 | Zhou .................... G06F 3/0611 |
| 2022/0291986 A1* | 9/2022 | Klein .................... G06F 3/0619 |

FOREIGN PATENT DOCUMENTS

| | | | |
|---|---|---|---|
| CN | 104516786 A | | 4/2015 |
| CN | 105589785 A | | 5/2016 |
| KR | 20020046627 A | * | 6/2002 |

OTHER PUBLICATIONS

Extended European Search Report issued in corresponding EP Application No. 16914680.0 dated Apr. 3, 2020, 22 Pages.

* cited by examiner

DETERMINATION OF FAULTY STATE OF STORAGE DEVICE

CROSS REFERENCE TO RELATED APPLICATION(S)

This application is a 35 U.S.C. § 371 National Stage of International Patent Application No. PCT/CN2016/098142, filed Sep. 5, 2016, designating the United States.

TECHNICAL FIELD

Embodiments of the present disclosure generally relate to the field of storage management, and in particular, to a method, an electronic device, and a computer program for determining a faulty state of a storage device.

BACKGROUND

It is desired to monitor failures of computer storage systems. To this end, some tools or solutions have been proposed. For example, self-monitoring, analysis and reporting technology (S.M.A.R.T.) can be built into storage devices, such as Advanced Technology Attachment (ATA)/Serial ATA (SATA) and Small Computer System Interface (SCSI)/Serial Attached SCSI (SAS) disks. These tools may provide early warning of an impending failure of a disk, for example. Such tools are conventionally specific to individual vendors. For example, attributes of the tools are stored in a vendor-specific storage area. Furthermore, representatives of the attributes for one vendor are different from those for another vendor. Accordingly, the tools lack universality and openness and further lack reliable validity.

In addition, when a bad health state of a storage device, such as Hard Disk Drive (HDD)/Solid State Disk (SSD), is reported by these tools, the storage device generally has already been in a faulty state for a period of time. This results in degraded user experiences, in particular, for some applications that require high read/write performances. Furthermore, these tools have to be persistently running in computer systems to monitor the state of the storage device. However, the persistent running of these tools may significantly increase loads of the systems.

SUMMARY

In general, example embodiments of the present disclosure provide a method and electronic device for determining a faulty state of a storage device.

In a first aspect, a method implemented in an electronic device is provided. According to the method, a first time length of a first access to a set of blocks of a storage device is determined. Then, the first time length of the access and a threshold time length are compared. If the first time length exceeds the threshold time length, it is determined that the blocks are in a potential faulty state.

In some embodiments, a statistical time length of accesses to the blocks may be determined. Then, the threshold time length may be determined at least in part based on the statistical time length.

In some embodiments, a second time length of a second access to the blocks may be determined. The second access being prior to the first access. The statistical time length may be determined based on the first and second time lengths. In some embodiments, the threshold time length may be adjusted based on a user input.

In some embodiments, the access is of an access type. Further, the threshold time length for the access type is determined.

In some embodiments, the first time length may be determined by monitoring start time and end time of the first access. In some embodiments, if it is determined that the blocks are in the potential faulty state, the blocks are isolated from the storage device.

In a second aspect, an electronic device is provided. The electronic device comprises: a first determining unit configured to determine a first time length of a first access to a set of blocks of a storage device; a comparing unit configured to compare the first time length of the access and a threshold time length; and a second determining unit configured to determine, in response to the first time length exceeding the threshold time length, determine that the blocks are in a potential faulty state.

In a third aspect, there is provided an electronic device. The electronic device comprises at least one processor and a memory. The memory contains instructions executable by the at least one processor, whereby the apparatus is operative to perform the method according to the first aspect.

In a fourth aspect, there is provided a computer program and a computer program product that is tangibly stored on a computer readable storage medium. Each of the computer program and the computer program product includes instructions which, when executed on at least one processor, cause the at least one processor to carry out the method according to the first aspect.

Through the following description, it will be appreciated that according to embodiments of the present disclosure, a set of blocks of a storage device is determined to be in a potential faulty state by comparing a time length of an access to the sets of the storage device and a threshold time length. In this way, the determination of the potential faulty state of the storage device may be more effective and efficient.

It is to be understood that the Summary section is not intended to identify key or essential features of embodiments of the present disclosure, nor is it intended to be used to limit the scope of the present disclosure. Other features of the present disclosure will become easily comprehensible through the following description.

BRIEF DESCRIPTION OF THE DRAWINGS

Through the more detailed description of some embodiments of the present disclosure with reference to the accompanying drawings, the above and other objects, features and advantages of the present disclosure will become more apparent, wherein.

Throughout the drawings, the same or similar reference numerals represent the same or similar element.

DETAILED DESCRIPTION

Principle of the present disclosure will now be described with reference to some example embodiments. It is to be understood that these embodiments are described only for the purpose of illustration and help those skilled in the art to understand and implement the present disclosure, without suggesting any limitations as to the scope of the disclosure. The disclosure described herein can be implemented in various manners other than the ones described below.

In the following description and claims, unless defined otherwise, all technical and scientific terms used herein have the same meaning as commonly understood by one of ordinary skill in the art to which this disclosure belongs.

As used herein, the term "storage device" refers to a device for storing information. Examples of the storage device include, but are not limited to, a hard disk (HDD/SSD), a portable computer diskette, a random access memory (RAM), a read-only memory (ROM), an erasable programmable read-only memory (EPROM or Flash memory), a portable compact disc read-only memory (CD-ROM), an optical storage device, a magnetic storage device, and the like.

As used herein, the term "time length of an access" or "access time length" refers to a time period during which data is input to or output from a storage device. The access type may include a write access or a read access.

As used herein, the singular forms "a", "an" and "the" are intended to include the plural forms as well, unless the context clearly indicates otherwise. The term "includes" and its variants are to be read as open terms that mean "includes, but is not limited to." The term "based on" is to be read as "based at least in part on." The term "one embodiment" and "an embodiment" are to be read as "at least one embodiment." The term "another embodiment" is to be read as "at least one other embodiment." Other definitions, explicit and implicit, may be included below.

Figure 1:
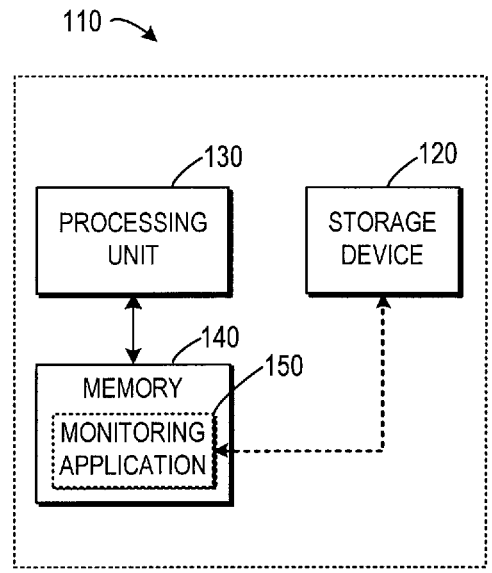
FIG. 1 is a block diagram of an example environment in which embodiments of the present disclosure can be implemented.

FIG. 1 shows an electronic device 110 in which embodiments of the present disclosure can be implemented. Examples of the electronic device 110 include, but are not limited to, computing devices such as a desktop personal computer (PC), tablet computer, laptop computer and a computer server, and communication devices capable of communications, such as a base station and a terminal device, and the like. Other devices may also easily employ embodiments of the present invention, such as a personal digital assistant (PDA), a pager, a mobile computer, a mobile TV, a gaming device, a laptop computer, a camera, a video camera, a GPS device, and the like.

The electronic device 110 comprises a storage device 120 which is divided into a set of blocks (not shown). The storage device 120 can be accessed by applications executed on or remotely to the electronic device 110. For example, the application may send an access request, such as a write request and/or a read request, for the storage device 120. In response to the access request, data can be written into or read from the storage device 120.

It is to be understood that the number of storage devices as shown in FIG. 1 are only for the purpose of illustration without suggesting any limitation of the present disclosure. It is also to be understood that although the storage device 120 is shown as being located within the electronic device 110, this is merely for the purpose of illustration. The storage device 120 can be located remotely and communicatively coupled to the electronic device 110.

The electronic device 110 also includes a processing unit 130 and a memory 140 coupled to the processing unit 130. The processing unit 130 may be of any type suitable to the local technical environment, and may include one or more of general purpose computers, special purpose computers, microprocessors, digital signal processors (DSPs) and processors based on multicore processor architecture, as non-limiting examples. The electronic device 110 may have multiple processors, such as an application specific integrated circuit chip that is slaved in time to a clock which synchronizes the main processor.

The memory 140 may be of any type suitable to the local technical environment and may be implemented using any suitable data storage technology, such as semiconductor based memory devices, magnetic memory devices and systems, optical memory devices and systems, fixed memory and removable memory, as non-limiting examples. While only one memory 140 is shown in the electronic device 110, there may be several physically distinct memory modules in the electronic device 110.

As described above, if the conventional monitoring tools report the faulty state of the storage device 120, the storage device 120 generally has been disabled for a while. Such a delay report significantly degrades user experiences especially for the applications that require high read/write performances. Therefore, there is a need for real-time detection of the faulty state of the storage device 120.

To this end, embodiments of the present disclosure propose a new solution for fault detection. For example, in some embodiments, According to embodiments of the present disclosure, the electronic device 110 includes a monitoring application 150 which, when executed by the processing unit 130, is at least partially loaded into the memory 140 and adapted to implement embodiments of the present disclosure. The operations of the monitoring application 150 will be detailed in the following paragraphs.

Figure 2:
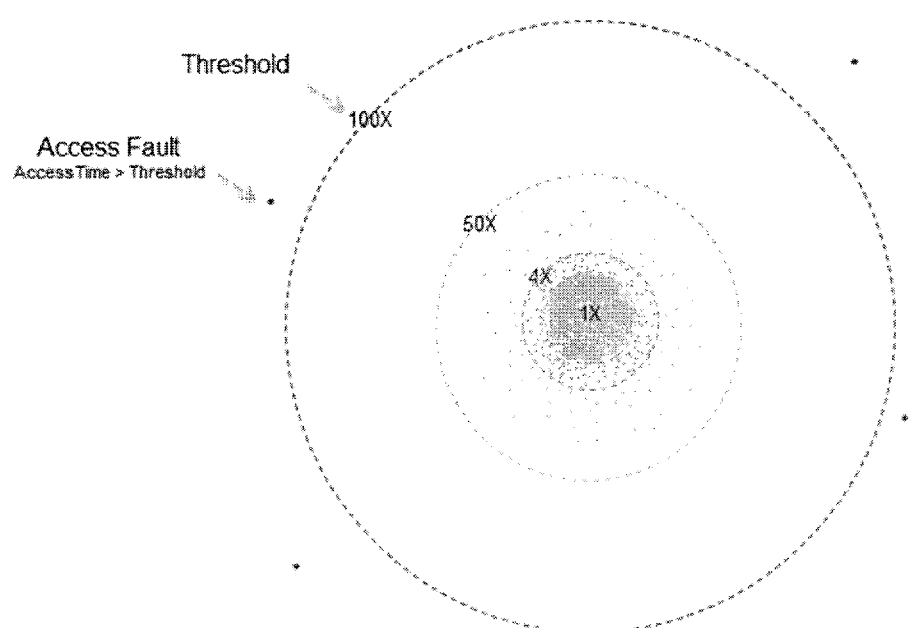
FIG. 2 is a diagram illustrating time lengths of accesses to storage devices in good and faulty states in accordance with some embodiments of the present disclosure.

The inventors found that when the performance of a storage device is significantly deteriorating, a time length of an access to the storage device becomes very long. FIG. 2 shows time lengths of accesses to storage devices in good and faulty states. These time lengths are detected for a set of HDD/SSD blocks in a disk. As shown, if blocks are faulty, the time lengths of the accesses to the blocks may over 100 times longer than the time lengths of the accesses to the good blocks.

In this situation, embodiments of the present disclosure provide determining a set of blocks of the storage device 120 to be in a potential faulty state by comparing a time length of an access to the blocks of the storage device 120 and a threshold time length. In the context of the present disclosure, a potential faulty state of a storage device refers to a state where the performance of the storage device is significantly degrading or deteriorating, especially, before the conventional tools report the faulty state of the storage device. Compared with the conventional monitoring methods, the determination of the potential faulty state of the storage device 120 in accordance with embodiments of the present disclosure is more effective and efficient.

Principles and implementations of the present disclosure will be described in detail below with reference to FIG. 3 which shows a flowchart of an example method 300 in accordance with some embodiments of the present disclosure. The method 300 can be implemented, for example, by the monitoring application 150 as shown in FIG. 1. For the purpose of discussion, the method 300 will be described with reference to FIG. 1.

At block 305, a time length of an access to a set of blocks of the storage device 120 is determined. For the sake of discussion, the access is referred to as a "first access," and the time length is referred to as a "first time length." The access may be of any suitable type. As described above, the access type may include the write access and/or the read access, for example.

According to embodiments of the present disclosure, the first time length of the first access may be determined in any suitable method. In some embodiments, the first time length may be determined by monitoring start time and end time of the first access. For example, during the procedure of the access, the start time and the end time of the access may be monitored. Then, a time difference between the start time and the end time may be calculated as the time length of the access. An example process of monitoring start time and end time of the access will be described below with reference to FIG. 4.

Figure 4:
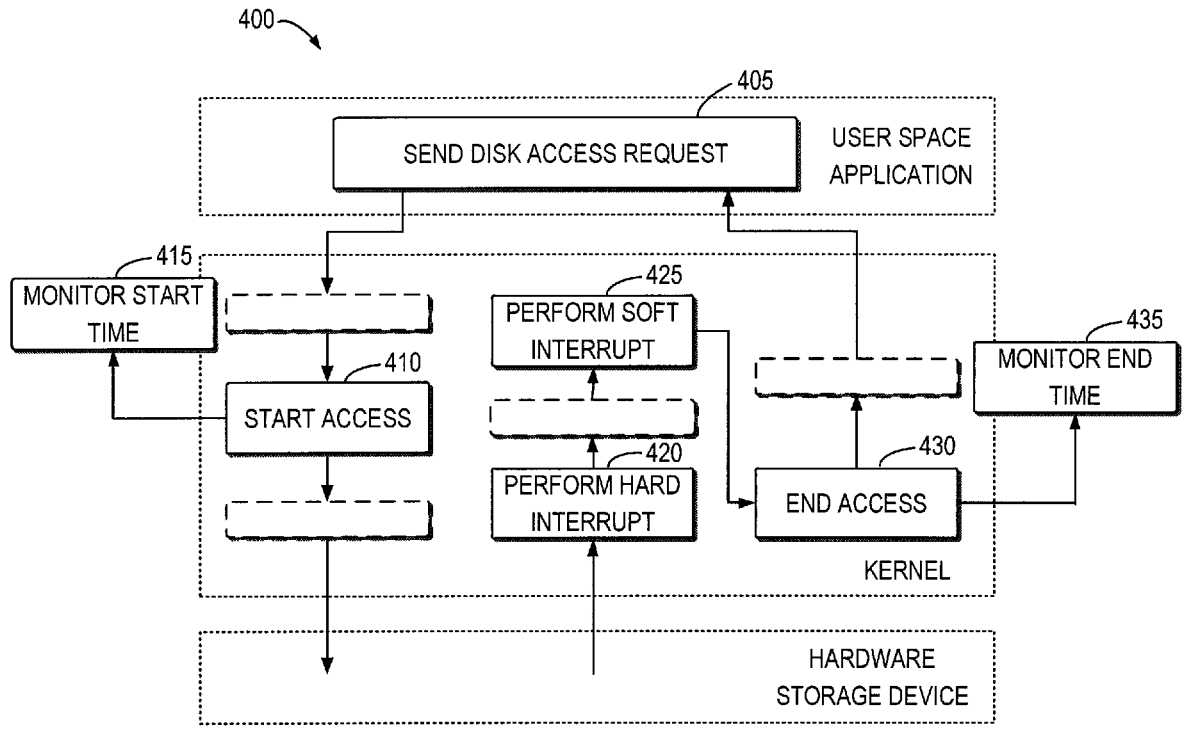
FIG. 4 is a flowchart of illustrates an example process of monitoring start time end time of an access according to some embodiments of the present disclosure.

As shown in FIG. 4, an application sends (405) a disk access request for a hardware storage device, which can be a SCSI device, for example. In response to the disk access request, a kernel of the operating system in the electronic device 110 starts (410) the access to the hardware storage device. In the context of the present disclosure, the kernel or core refers to a control center of the operating system. The starting (410) of the access may be implemented via a system function in a disk drive within the kernel. In this example, as shown, in response to the starting (410) of the access, the start time is monitored (415), for example, by the monitoring application 150.

In response to returning of the access results by the hardware storage device, the kernel performs (415) hard interrupt and further performs (420) soft interrupt to obtain the access results. Then, the kernel ends (430) the access and returns the access results to the application. Likewise, the hard interrupt (420), the soft interrupt (425), and the ending (430) of the access may also be implemented via system functions in the disk drive. In response to the ending (430) of the access, the end time is monitored (435) as shown. After the access is ended (430), the time difference between the start time and the end time may be calculated as the time length of the access.

It is to be understood that the access procedure as described above with reference to FIG. 4 is only for the purpose of illustration. The access procedure may involve one or more other actions implemented by the kernel, which are shown by dashed boxes, and/or other actions implemented by other elements (not shown). The access procedure is known in the art, and more details thereof will be omitted.

It is also to be understood that the access to the hardware storage device by the user space application as shown in FIG. 4 is for the purpose of illustration without suggesting any limitation. The start and end time of the accesses to the hardware storage device by other applications, such as system space applications, may also be monitored to determine the time lengths of these accesses.

Figure 3:
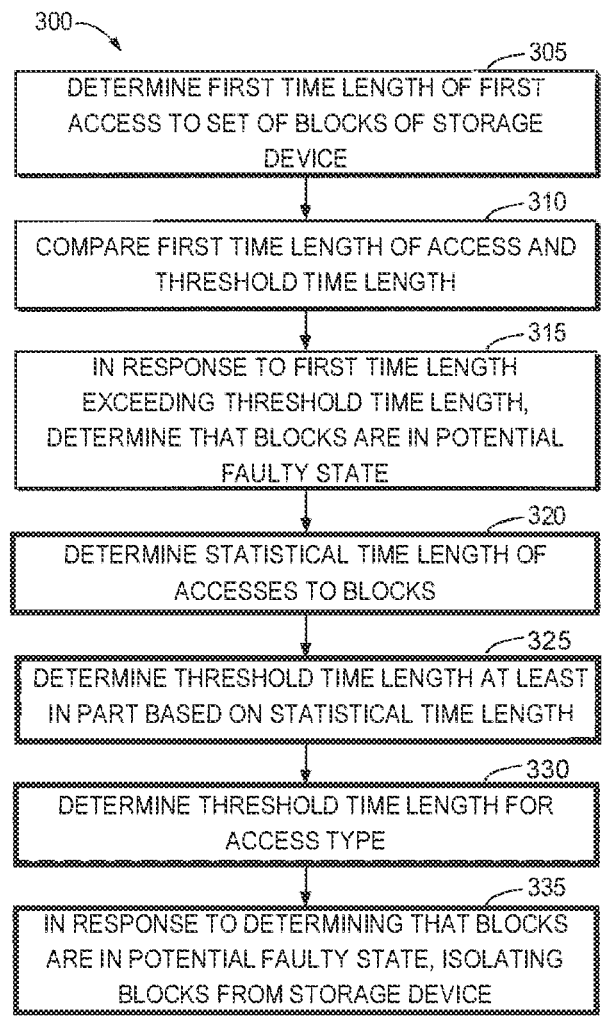
FIG. 3 is a flowchart of a method in accordance with some embodiments of the present disclosure.

Still in reference with FIG. 3, at block 310, the first time length of the access and a threshold time length are compared. At block 315, if the first time length exceeds the threshold time length, it is determined that the blocks of the storage device 120 are in a potential faulty state.

As described above, it is found that if the performance of the storage device is significant degrading, the time length of the access to the storage device becomes extremely long. As a result, by comparing the first time length of the access and the threshold time length, the potential fault of the storage device 120 can be determined.

The threshold time length may be determined in any suitable way. In some embodiments, the threshold time length may be determined based on statistics of a plurality of accesses. For example, as shown in FIG. 3, at block 320, a statistical time length of the accesses to the blocks of the storage device 120 may be determined. At block 325, the threshold time length may be determined based on the statistical time length.

In some embodiments, the accesses may contain an access (referred to as a "second access") prior to the first access. For example, a time length (referred to as a "second time length") of the second access to the blocks may be determined. Similar to the determination of the first time length of the first access at block 305, any suitable method may be used to implement the determination of the second time length. After the second time length is determined, the statistical time length may be determined based on the statistics of the first and second time lengths. These statistics may be performed according to any statistics methods either currently known or to be developed in the future.

In addition, in some embodiments, the threshold time length that is determined based on the statistics may be further adjusted based on a user input. For example, users may adjust the determined threshold time length by taking a specific factor into account. By way of example, for the application requiring the higher read/write performance, the threshold time length may be further adjusted to be shorter. The adjustment may further improve the universality and openness of the detection the potential faulty state of the storage device.

The inventors also found that the time lengths associated with different access types are different. For example, for HDD/SSD blocks, when the blocks are deteriorating, the time length of the write access to the blocks is longer than the time length of the read access to the blocks. Accordingly, in some embodiments, at block 330, the threshold time length may be determined for a specific access type. For example, two threshold time lengths may be determined respectively for the write access and the read access.

As shown in FIG. 3, in some embodiments, if it is determined at block 315 that the blocks of the storage device 120 are in the potential faulty state, the potential faulty blocks are isolated from the storage device 120 at block 335. For example, during the determination of the first time length of the first access at block 305, in addition to the start and end time of the first access, the accessed blocks may also be located. Then, if it is determined that the time difference between the start and end time of the first access exceeds the threshold time length at block 310, the accessed blocks is determined to be in the potential faulty state at block 315, and then the accessed blocks are isolated from the storage device 120 at block 320. Any suitable isolation method that is either currently known or to be developed in the future will be used. In this way, life time of the storage device 120 may be extended.

Figure 5:
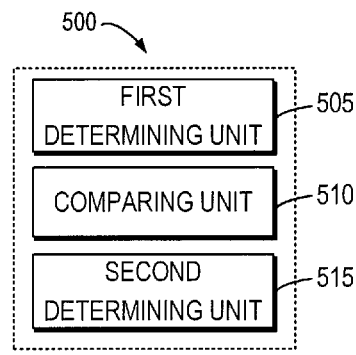
FIG. 5 is a block diagram of an electronic device in accordance with some embodiments of the present disclosure.

FIG. 5 shows a block diagram of an electronic device 500 in accordance with some other embodiments of the present disclosure. The electronic device 500 can be considered an example implementation of the electronic device 110 as shown in FIG. 1.

As shown, the electronic device 500 comprises a first determining unit 505, a comparing unit 510, and a second determining unit 515. The first determining unit 505 is configured to determine a first time length of a first access to a set of blocks of a storage device. The comparing unit 510 is configured to compare the first time length of the access and a threshold time length. The second determining unit 515 is configured to determine, in response to the first time length exceeding the threshold time length, determine that the blocks are in a potential faulty state.

In some embodiments, the electronic device 500 may further comprise: a third determining unit configured to determine a statistical time length of accesses to the blocks; and a fourth determining unit configured to determine the threshold time length at least in part based on the statistical time length. In some embodiments, the third determining unit may comprise: a fifth determining unit configured to determine a second time length of a second access to the blocks, the second access being prior to the first access; and a sixth determining unit configured to determine the statistical time length based on the first and second time lengths. In some embodiments, the fourth determining unit may comprise: an adjusting unit configured to adjust the threshold time length based on a user input.

In some embodiments, the access may be of an access type. In these embodiments, the electronic device 500 may further comprise: a seventh determining unit configured to determine the threshold time length for the access type.

In some embodiments, the first determining unit 505 may comprise an eighth determining unit. The eighth determining unit is configured to determine the first time length by monitoring start time and end time of the first access.

In some embodiments, the electronic device 500 may further comprise an isolating unit. The isolating unit is configured to, in response to determining that the blocks are in the potential faulty state, isolating the blocks from the storage device.

It should be appreciated that units included in the electronic device 500 correspond to the blocks of the method 300. Therefore, all operations and features described above with reference to FIGS. 1 to 3 are likewise applicable to the units included in the electronic device 500 and have similar effects. For the purpose of simplification, the details will be omitted.

The units included in the electronic device 500 may be implemented in various manners, including software, hardware, firmware, or any combination thereof. In one embodiment, one or more units may be implemented using software and/or firmware, for example, machine-executable instructions stored on the storage medium. In addition to or instead of machine-executable instructions, parts or all of the units in the electronic device 500 may be implemented, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), and the like.

Generally, various embodiments of the present disclosure may be implemented in hardware or special purpose circuits, software, logic or any combination thereof. Some aspects may be implemented in hardware, while other aspects may be implemented in firmware or software which may be executed by a controller, microprocessor or other computing device. While various aspects of embodiments of the present disclosure are illustrated and described as block diagrams, flowcharts, or using some other pictorial representation, it will be appreciated that the blocks, apparatus, systems, techniques or methods described herein may be implemented in, as non-limiting examples, hardware, software, firmware, special purpose circuits or logic, general purpose hardware or controller or other computing devices, or some combination thereof.

By way of example, embodiments of the present disclosure can be described in the general context of machine-executable instructions, such as those included in program modules, being executed in a device on a target real or virtual processor. Generally, program modules include routines, programs, libraries, objects, classes, components, data structures, or the like that perform particular tasks or implement particular abstract data types. The functionality of the program modules may be combined or split between program modules as desired in various embodiments. Machine-executable instructions for program modules may be executed within a local or distributed device. In a distributed device, program modules may be located in both local and remote storage media.

Program code for carrying out methods of the present disclosure may be written in any combination of one or more programming languages. These program codes may be provided to a processor or controller of a general purpose computer, special purpose computer, or other programmable data processing apparatus, such that the program codes, when executed by the processor or controller, cause the functions/operations specified in the flowcharts and/or block diagrams to be implemented. The program code may execute entirely on a machine, partly on the machine, as a stand-alone software package, partly on the machine and partly on a remote machine or entirely on the remote machine or server.

In the context of this disclosure, a machine readable medium may be any tangible medium that may contain, or store a program for use by or in connection with an instruction execution system, apparatus, or device. The machine readable medium may be a machine readable signal medium or a machine readable storage medium. A machine readable medium may include but not limited to an electronic, magnetic, optical, electromagnetic, infrared, or semiconductor system, apparatus, or device, or any suitable combination of the foregoing. More specific examples of the machine readable storage medium would include an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of the present disclosure, but rather as descriptions of features that may be specific to particular embodiments. Certain features that are described in the context of separate embodiments may also be implemented in combination in a single embodiment. Conversely, various features that are described in the context of a single embodiment may also be implemented in multiple embodiments separately or in any suitable sub-combination.

Although the present disclosure has been described in language specific to structural features and/or functional actions, it is to be understood that the present disclosure defined in the appended claims is not necessarily limited to the specific features or actions described above. Rather, the specific features and acts described above are disclosed as example forms of implementing the claims.

What is claimed is:

1. A method implemented in an electronic device, the method comprising:
   determining a first time length of a first read access to a set of blocks of a storage device, wherein the first time length of the first read access is determined by calculating a time difference between a start time of the first read access and an end time of the first read access;
   determining a threshold time length for the first read access;
   comparing the first time length of the first read access against the threshold time length for the first read access; and
   in response to the first time length of the first read access exceeding the threshold time length for the first read access, determining that the set of blocks are in a potential faulty state;
   wherein determining the threshold time length for the first read access comprises:
      determining a statistical time length of read accesses to the set of blocks based on the first time length of the first read access to the set of blocks and a second time length of a second read access to the set of blocks, the second read access being prior to the first read access;
      determining the threshold time length for the first read access at least in part based on the statistical time length of the read accesses; and
      adjusting the determined threshold time length for the first read access based on a performance factor, wherein adjusting the determined threshold time length for the first read access based on the performance factor comprises shortening the determined threshold time length for the first read access based on a requirement of improving universality and openness of detection of the potential faulty state; and
   in response to determining that the set of blocks are in the potential faulty state, isolating the set of blocks from the storage device.

2. The method of claim 1, wherein determining the first time length comprises:
   determining the first time length by monitoring the start time and the end time of the first read access.

3. The method of claim 1, further comprising:
   in response to determining that the set of blocks are in the potential faulty state, isolating the set of blocks from the storage device instead of replacing the set of blocks with any reserved blocks.

4. An electronic device, comprising:
   one or more processors; and
   memory comprising instructions which, when executed by the one or more processors, cause the electronic device to:
      determine a first time length of a first read access to a set of blocks of a storage device, wherein the first time length of the first read access is determined by calculating a time difference between a start time of the first read access and an end time of the first read access;
      determine a threshold time length for the first read access;
      compare the first time length of the first read access against the threshold time length for the first read access; and
      in response to the first time length of the first read access exceeding the threshold time length for the first read access, determine that the set of blocks are in a potential faulty state;
      wherein determining the threshold time length for the first read access comprises:
         determining a statistical time length of read accesses to the set of blocks based on the first time length of the first read access to the set of blocks and a second time length of a second read access to the set of blocks, the second read access being prior to the first read access;
         determining the threshold time length for the first read access at least in part based on the statistical time length of the read accesses; and
         adjusting the determined threshold time length for the first read access based on a performance factor, wherein adjusting the determined threshold time length for the first read access based on the performance factor comprises shortening the determined threshold time length for the first read access based on a requirement of improving universality and openness of detection of the potential faulty state; and
      in response to determining that the set of blocks are in the potential faulty state, isolating the set of blocks from the storage device.

5. The electronic device of claim 4, wherein the instructions which, when executed by the one or more processors, further cause the electronic device to:
   determine the first time length of the first read access by monitoring the start time and the end time of the first read access.

6. The electronic device of claim 4, wherein the instructions which, when executed by the one or more processors, further cause the electronic device to:
   in response to the determination that the set of blocks are in the potential faulty state, isolate the set of blocks from the storage device instead of replacing the set of blocks with any reserved blocks.

7. A non-transitory computer-readable storage medium, having stored thereon a computer program comprising instructions which, when executed by one or more processors of an electronic device, cause the one or more processors to carry out the method according to claim 1.

* * * * *